United States Patent [19]

Uratsuji et al.

[11] Patent Number: 5,320,559
[45] Date of Patent: Jun. 14, 1994

[54] CONNECTOR FOR LEADLESS IC PACKAGE

[75] Inventors: Kazumi Uratsuji, Tokyo; Noriyuki Matsuoka, Yokohama, both of Japan

[73] Assignee: Yamaichi Electric Co., Ltd., Tokyo, Japan

[21] Appl. No.: 90,644

[22] Filed: Jul. 13, 1993

Related U.S. Application Data

[63] Continuation of Ser. No. 849,664, Mar. 10, 1992, abandoned.

[30] Foreign Application Priority Data

Mar. 15, 1991 [JP] Japan .................................. 3-075864

[51] Int. Cl.$^5$ ............................................. H01R 11/18
[52] U.S. Cl. ................................. 439/482; 324/158 F; 439/65
[58] Field of Search ............... 439/55, 65, 482, 74–75; 324/72.5, 158 F, 158 P

[56] References Cited

U.S. PATENT DOCUMENTS

| 4,423,376 | 12/1983 | Byrnes et al. ................ 324/158 F X |
| 4,622,514 | 11/1986 | Lewis .............................. 324/72.5 X |
| 4,963,822 | 10/1990 | Prokopp ......................... 324/72.5 X |

FOREIGN PATENT DOCUMENTS

| 3123627 | 12/1982 | Fed. Rep. of Germany ...... 439/660 |
| 63-25467 | 2/1988 | Japan . |
| 2-31790 | 8/1990 | Japan . |

*Primary Examiner*—Khiem Nguyen
*Attorney, Agent, or Firm*—Wenderoth, Lind & Ponack

[57] ABSTRACT

A connector for a leadless IC package having contacts to be pressure contacted with conductive pads arranged on a lower surface of a leadless IC, wherein each of the contacts is formed of a spring element, the connector including a contact holding portion in which the spring element is implanted, a contact braking portion disposed above the contact holding portion, and a contact operating portion laterally movably disposed between the contact braking portion and the contact holding portion, the spring element extending through a contact operating through-hole formed in the operating portion, a distal end of the spring element being received in a contact braking through-hole formed in the braking portion, the spring element being sidewardly pressurized by an inner wall of the contact operating through-hole when the operating portion is moved in one direction, so that the spring element is bent and displaced, the spring element being restored to its original state when the operating portion is laterally moved in the other direction, the distal end portion of the spring element being extended and retracted while it is braked by the inner wall of the contact braking through-hole by the bending displacement and restoration, the distal end portion of the spring element being pressure contacted the conductive pad of the IC when the spring element is expanded.

3 Claims, 6 Drawing Sheets

FIG. 5
FIG. 6
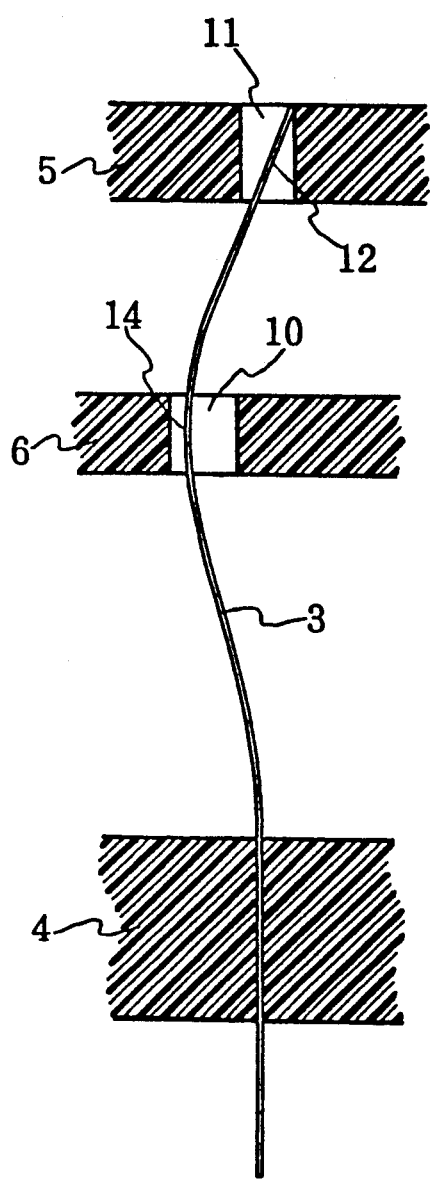
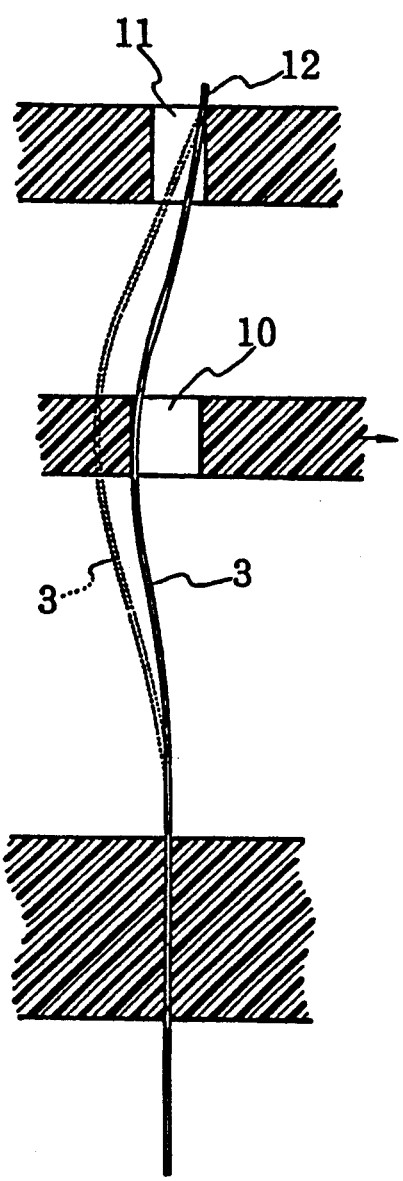

CONNECTOR FOR LEADLESS IC PACKAGE

This application is a continuation of now abandoned application, Ser. No. 07/849,664, filed Mar. 10, 1992.

BACKGROUND OF THE INVENTION

1. Field of the Invention

This invention relates to a connector for a leadless IC having a number of conductive pads (terminals) on its lower surface.

2. Brief Description of the Prior Art

In the above-mentioned leadless IC measuring socket, etc., a mount-to-contact type connector has heretofore been used. This mount-to-contact type connector, as represented by, for example, Japanese Utility Model Publication No. Hei 2-31790, includes a contact having a horizontal U-shaped contact piece, the horizontal U-shaped contact piece being provided with a male terminal extending from a lower arm thereof, the arm being flexed when a leadless IC package with a conductive pad disposed on a lower surface is mounted on a free end of an upper arm of the horizontal U-shaped contact piece and a downward push-down force is exerted on the IC in order to obtain a contact pressure with the conductive pad by reaction thereof.

Also, in Japanese Utility Model Early Laid-open Publication No. Sho 63-25467, a movable terminal is nested in a sleeve terminal having a male terminal and resiliently held by a coil spring disposed within the sleeve terminal, the coil spring being compressed when its distal end portion exposed through an opening portion of the sleeve terminal is pushed by a conductive pad, etc. in order to obtain a contact pressure by reaction thereof.

However, the largest problem for the former type structure is that since the horizontal U-shaped contact piece extends outward from two or four peripheral sides of IC, the connector becomes large in outer size and thus inferior in mounting efficiency. Furthermore, although the contact can be used, without any trouble, for an IC having conductive pads arranged along the edge portion thereof, it becomes difficult to use for IC having a number of conductive pads which are arranged in several rows in a lattice pattern as shown in FIG. 8 herein.

In the latter sleeve type contact, there are problems that the number of component parts is increased, the sleeve terminal is required to be highly accurately cut, and the cost is high. Moreover, the operating force required for pushing the conductive pad against the movable terminal becomes excessively large. In addition, since the movable terminal is nested in the sleeve terminal, miniaturization and high density arrangement are limited due to restriction of the diameter thereof.

SUMMARY OF THE INVENTION

It is therefore an object of the present invention to provide, in order to obviate the above problems, a connector most suitably designed for a leadless IC package, in which high density arrangement and miniaturization are obtainable, and reliable contact and no-load insertion are available.

As means for achieving the above object, the contact is formed of a spring element which is formed of a plate member puched out of a sheet, or a wire member, the spring element being implanted in a contact holding portion forming a connector body and a distal end of the spring element being received in a through-hole of a contact braking portion, the spring element being permitted to penetrate through a through-hole formed in the contact operating portion which forms a connector body disposed between the contact holding portion and the contact braking portion, the spring element being bent and displaced by the inner wall of the contact operating through-hole or restored upon lateral movement of the operating portion, the distal end of the spring element being extended and retracted while it is braked by the contact braking through-hole in accordance with the bending displacement or restoration of the spring element, the spring element being pressure contacted with a conductive pad of a leadless IC disposed opposite the contact braking through-hole when the spring element is expanded.

When the spring element is bent upon lateral movement of the operating portion in one direction, the spring element is contracted while the distal end portion of the spring element is braked by the inner wall of the contact braking through-hole in accordance with the bending. When the operating portion is laterally moved in the other direction, the spring element is restored and expanded. If a curved portion or bent portion is formed on the spring element beforehand and the spring element is bent and displaced in a direction for removing the bent portion by pushing the protruded side of the bent portion in accordance with the lateral movement of the operating portion in one direction, the distal end portion of the spring element is extended within the contact braking through-hole. When the operating portion is laterally moved in the other direction, the spring element is restored to its original state and contracted.

The spring element is contracted by a selected one of the above-mentioned means to lower the distal end of the spring element from a pressure contact position to a non-pressure-contact position within the braking through-hole, and in that state, the leadless IC is mounted on the braking portion so that the conductive pad arranged on the lower surface thereof is placed opposite the distal end portion of the spring element, i.e., the contact braking through-hole. Then, the spring element is expanded by selected one of above-mentioned means in order to bring the distal end of the spring element into pressure contact with the corresponding conductive pad.

Since the spring element is disposed at the contact holding portion in its generally upright state so that the distal end thereof can contact the leadless IC, the area occupied by each spring element can be extensively reduced compared with the conventional contact of this type, and therefore, the spring elements can be implanted in high density in a limited area. Furthermore, by implanting the spring elements in a surface area corresponding to the lower surface of an IC in high density, they can be held in correspondence with the conductive pads. Therefore, the connector of the present invention can be suitably applied to a leadless IC of the type in which a number of conductive pads are arranged on its lower surface.

Moreover, since the distal end of the spring element is pressure contacted with the conductive pad while it is braked by the contact braking through-hole corresponding to the conductive pad, a highly reliable contact can be obtained between each spring element and each conductive pad. Furthermore, it is no longer required to obtain a contact pressure by pushing down the leadless IC against the contact as in the conventional connector, so that the above-mentioned effects can be obtained while achieving no-load insertion of the connector.

BRIEF DESCRIPTION OF THE DRAWING

FIG. 5 is likewise an enlarged sectional view showing a connector for a leadless IC package according to a third embodiment of the present invention;

FIG. 6 is likewise an enlarged sectional view showing an important part of the connector according to the third embodiment wherein a spring element is in its flexed state;

DETAILED DESCRIPTION OF THE EMBODIMENT

Several embodiments of the present invention will now be described with reference to FIGS. 1 through 8 of the accompanying drawings.

Figure 8:
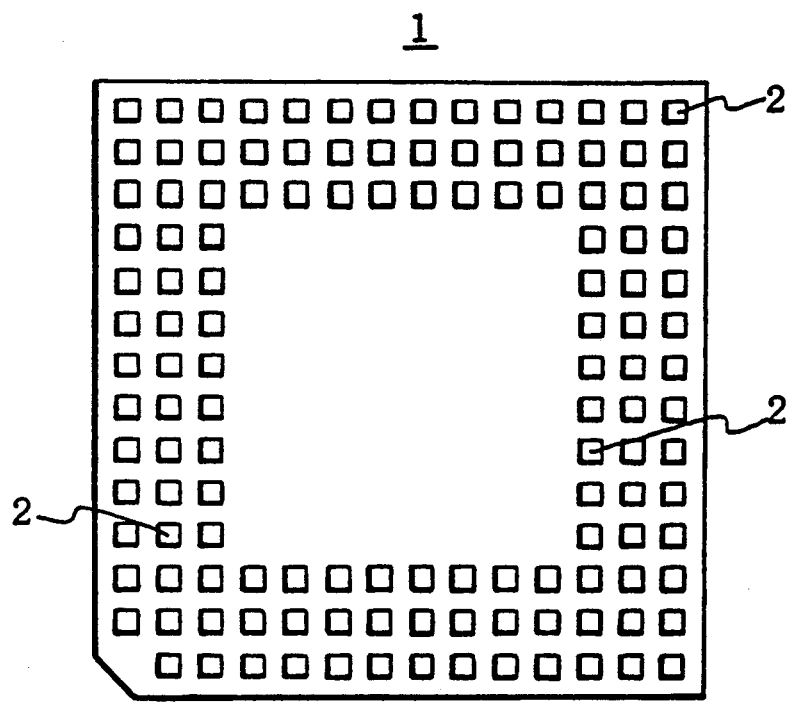
FIG. 8 is a bottom view of an IC showing one example of a leadless IC.

This invention relates to a connector used for a leadless IC having a number of conductive pads arranged on a lower surface thereof as mentioned above. FIG. 8 shows an LGA (Land Grid Array) type IC as one example of the leadless IC, in which a number of conductive pads 2 are arranged in a lattice pattern on a lower surface of a leadless IC 1. The connector according to the first embodiment is shown in FIGS. 1-3C has contacts which are to be pressure contacted with the conductive pads 2. The contacts are each formed of a spring element 3. The spring element 3 is formed by punching out from a metal plate having a sufficient resiliency an elongate shape, or it is formed of a metal wire.

On the other hand, a connector body includes a contact holding portion 4 formed of an insulating plate having the spring element 3 implanted therein, a contact braking portion 5 formed of an insulating plate and disposed in a position higher than the contact holding portion 4, and a contact operating portion 6 formed of an insulating plate and disposed between the contact braking portion 5 and the contact holding portion 4 in such a manner that the contact operating portion 6 can be laterally moved in parallel relation with respect to the contact braking portion 5 and contact holding portion 4.

The contact holding portion 4, contact braking portion 5 and contact operating portion 6 are each formed as separate parts and then arranged in parallel relation. Alternatively, the holding portion 4 and braking portion 5 can be formed as an integrally molded product, and the operating portion 6 is formed as a separate part. The three portions 4, 5 and 6 are spacedly arranged in parallel relation as shown in the Figures. The three portions 4, 5 and 6 may be disposed in such a manner as to be overlapped with respect to one another. The numeral 7 denotes a space between the operating portion 6 and the holding portion 4, and 8, a space between the operating portion 6 and the braking portion 5, respectively.

On the other hand, the spring element 3 is implanted in the contact holding portion 4, a lower end of the spring element 3 being extended downward to form a male terminal 9 which is to be contacted with a wiring board, etc. The spring element 3 implanted in the holding portion 4 extends upwardly of the holding portion 4 in a generally upright state. The operating portion 6 is provided with a through-hole for the operation of the contact, and the spring element 3 extends through the through-hole 10. Further, the braking portion 5 is provided with a through-hole 11 for braking the contact, so that a distal end portion 12 of the spring element 3 extending into the through-hole 10 is received in the through-hole 11. The distal end portion 12 of the spring element 3 is placed under the restriction of the contact braking through-hole 11 such that the distal end of the spring element 3 can be extended and retracted in the vertical direction within the through-hole 11 while its sideward displacement is restricted by the inner wall of the through-hole 11.

Figure 1:
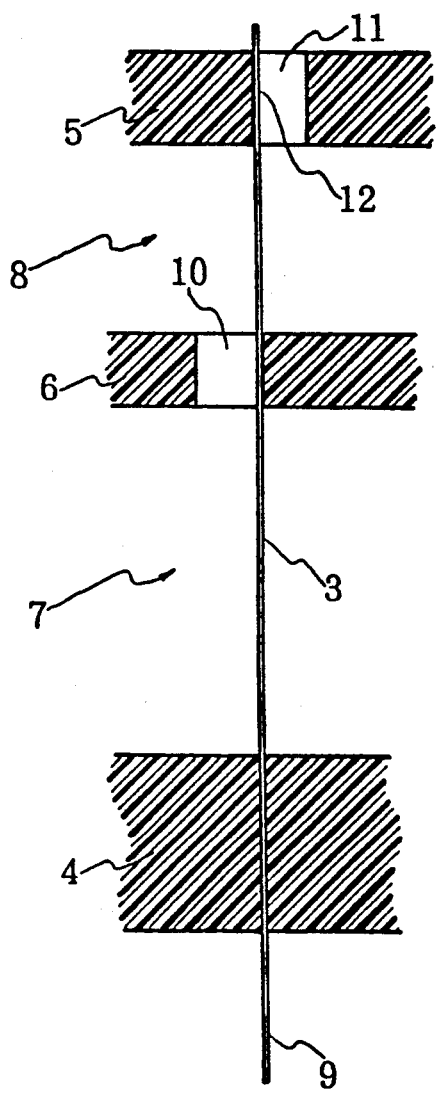
FIG. 1 is an enlarged sectional view showing an important part of a connector for a leadless IC package according to a first embodiment of the present invention.
Figure 3A:
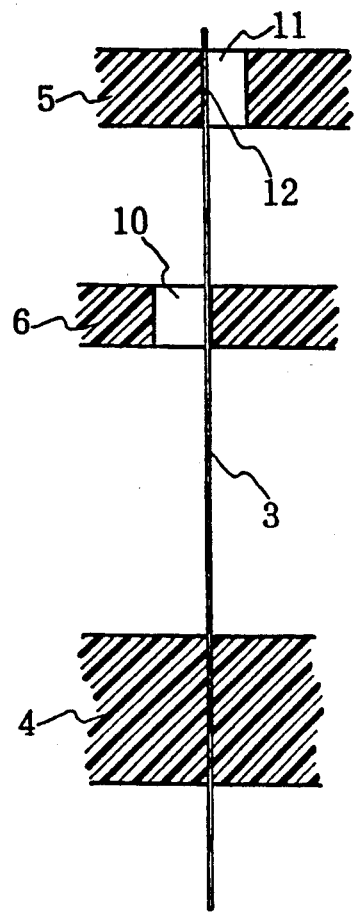
FIGS. 3A, 3B, 3C are enlarged sectional views of an important part of the connector, showing a sequence of action of an operating portion and the spring element when a leadless IC is mounted on the connector for a leadless IC package.

As one example, as is shown in FIGS. 1 and 3(A), the spring element 3 is disposed along the inner wall surface on the pushing side of the contact operating through-hole 10, while the distal end portion 12 of the spring element 3 is disposed along the inner surface on the opposite side of the contact operating through-hole 11 with respect to the pushing side. As one example, the spring element 3 is formed in a linear shape at least in the portion extending upright above the holding portion 4, and the upright element is inserted into the contact operating through-hole 10 and disposed along the inner wall surface on the pushing side of the through-hole 10. Furthermore, a distal end portion of the upright element is disposed along the inner wall of the hole opposite the contact braking through-hole 11.

Figure 2:
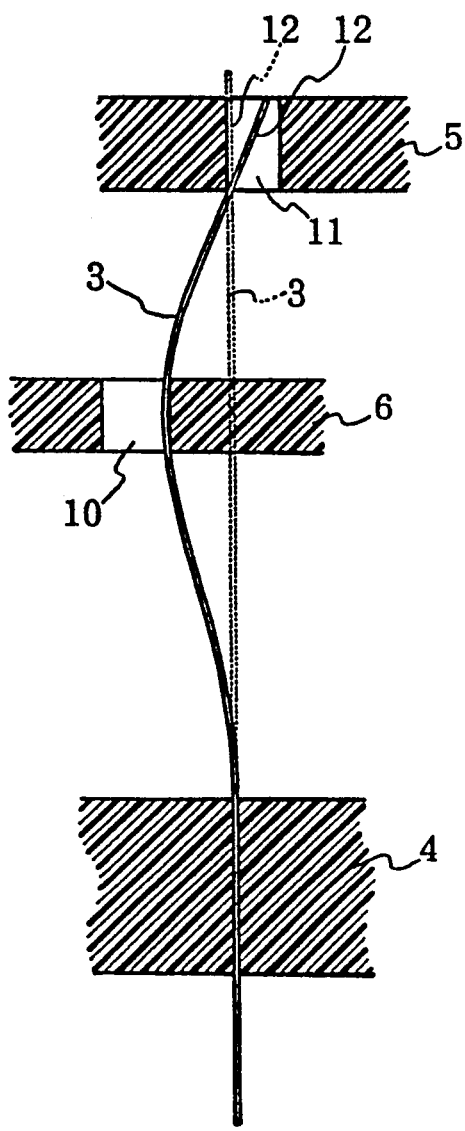
FIG. 2 is likewise an enlarged sectional view showing an important part of the connector wherein a spring element is in its flexed state.
Figure 3B:
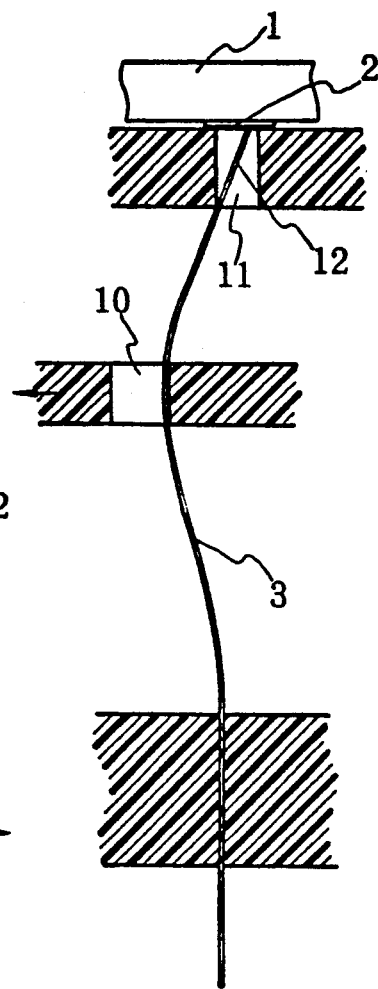

As shown in FIGS. 2 and 3(B), when the operating portion 6 is laterally moved in one direction, the spring element 3 is sidewardly pressurized by the inner wall of the contact operating through-hole 10 so as to be bent and contracted into a state indicated by the solid line from a state indicated by the dotted lines while sliding on the inner wall surface of the braking through-hole 11. By this, the distal end portion 12 of the spring element 3 is retracted downward within the contact braking through-hole 11 while being braked by the inner wall of the through-hole 11. In that state, the leadless IC 1 is mounted on the braking portion 5 such that its conductive pad 2 is placed opposite the contact braking through-hole 11 and the distal end portion 12 of the spring element 3. When the leadless IC 1 is mounted on the braking portion 5, the conductive pad 2 and the distal end portion of the spring element 3 are held in a contact or non-contact state.

Figure 3C:
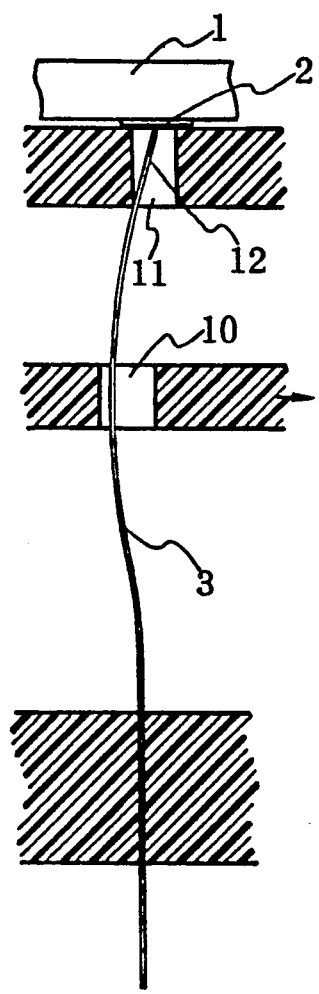
Figure 4:
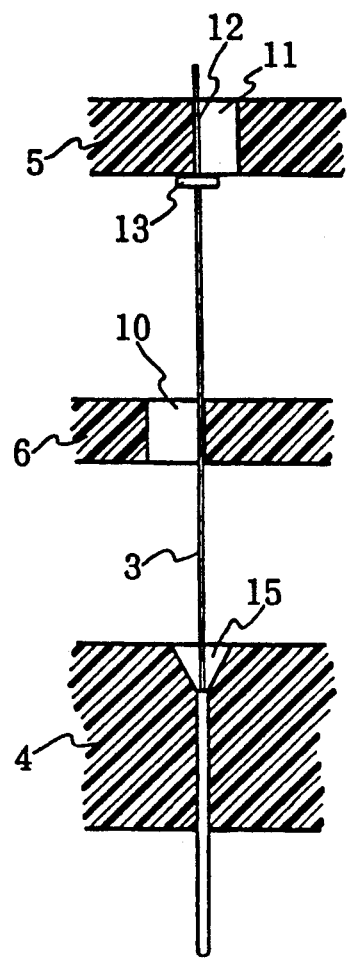
FIGS. 4A, 4B, 4C are enlarged sectional view of the connector, showing a sequence of action of an operating portion and the spring element when a leadless IC is mounted on a connector for a leadless IC package according to a second embodiment of the present invention.
Figure 4:
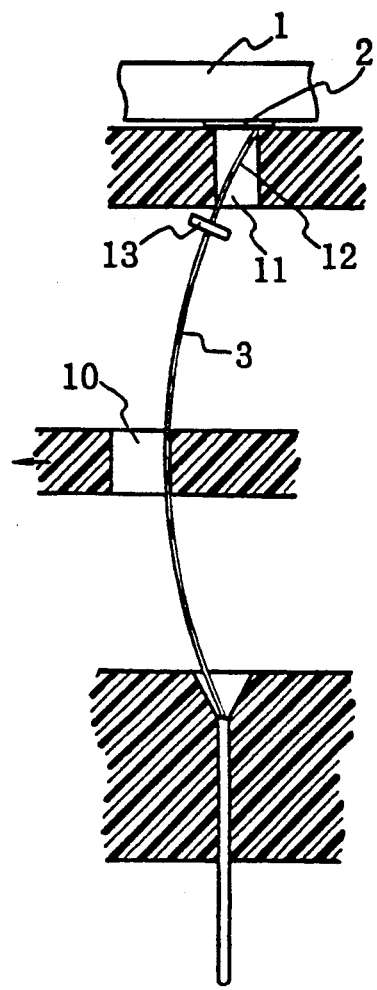
Figure 4:
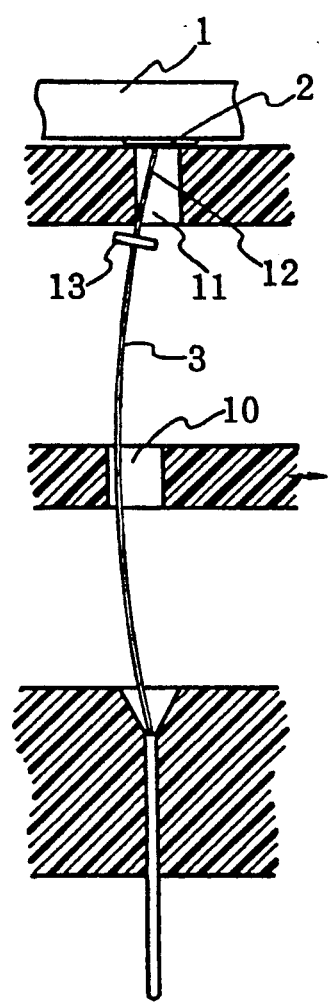

When the operating portion 6 is laterally moved in the other direction after the leadless IC 1 has been mounted on the braking portion 5, the spring element 3 is permitted to be restored to its original shape in which the distal end portion 12 of the spring element 3 is extended within the contact braking through-hole 11 as shown in FIG. 3(C). During the restoring process, the spring element 3 is pressure contacted with the conductive pad 2 which is placed opposite the through-hole 11. In order to maintain the pressure contact state, the leadless IC 1 is pressed by a presser cover or robot attached to the socket body.

In the above embodiment, the distal end portion of the spring element 3 is resiliently pressure contacted with the conductive pad 2 by its axial restoring force. At that time, a shear face of the spring element 3 is pressure contacted with the conductive pad 2 when the spring element 3 is expanded. Although not illustrated, it may be designed such that the distal end portion of the spring element 3 is curved in an inverted L or U shape and such curved portion is pressure contacted with the conductive pad 2. Also in the above embodiment, the leadless IC 1 is mounted on the upper surface of the contact braking portion 5.

As another example of the present invention, it may be designed such that the leadless IC 1 is supported in a floating state above the upper surface of the contact braking portion 5 instead of being directly mounted on the upper surface of the contact braking portion 5, and the conductive pad 2 is disposed in such a manner as to be spaced apart from the upper surface of the braking portion 5, i.e., the upper opening edge of the braking through-hole 11. In that case, there may be provided a supporting portion which supports the corner portion, etc. of the leadless IC 1 in a floating state from the contact holding portion 4 or contact braking portion 5.

In a second embodiment as shown in FIGS. 4(A), 4(B) and 4(C), the spring element 3 is provided at a distal end portion 12 thereof with a stopper 13, and the stopper 13 is brought into abutment against a lower surface of the braking portion 5 during the expansion process of the spring element 3 in order to restrict the amount of expansion thereof. In FIG. 4(A), the stopper 13 is curved beforehand, so that it will be abutted against the lower surface of the braking portion 5 during the expansion process thereof. By restricting the expansion of the spring element 3 during its restoring and expanding process by the stopper 13, the amount of expansion can always be maintained constant. The remaining structure is the same as that of the first embodiment.

In the second embodiment, in order to enhance the bending displacement of the spring element 3, a divergent opening 15 is formed at an upper end of that portion of the contact holding portion 4 in which the contact is implanted.

In the first embodiment, the spring element 3 is bent and contracted, so that it will be expanded during the restoring process. On the contrary, in the third embodiment shown in 5-7C, the spring element 3 is bent in its normal condition, and is expanded, so that it be contracted during its restoration to its normal condition.

Figure 7A:
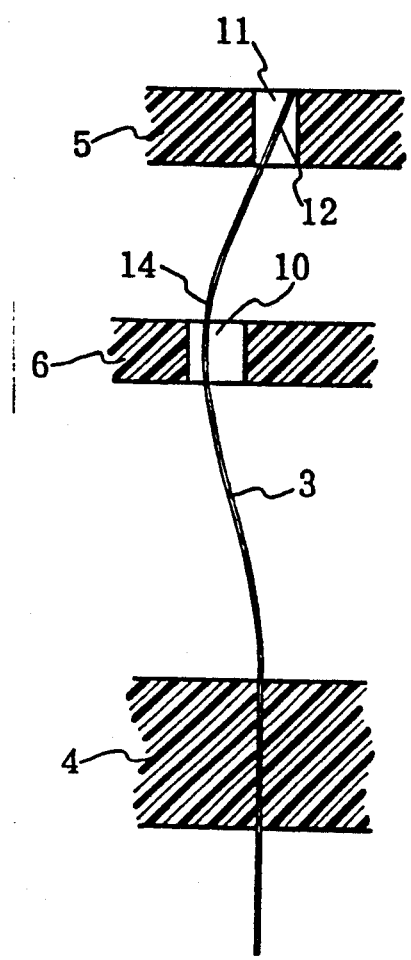
FIGS. 7(A), 7(B) and 7(C) are likewise enlarged sectional views, showing a sequence of action of an operating portion and the spring element when a leadless IC is mounted on a connector for a leadless IC package according to the third embodiment of the present invention.

To be more specific, as is shown in FIGS. 5 and 7(A), that portion of the spring element 3 extending into the contact operating through-hole 10 is formed into a curved portion or bent portion 14 beforehand, and as shown in FIG. 6, the operating portion 6 is laterally moved in one direction so that a protruded portion side of the bent 14 is sidewardly pressurized by the inner wall of the contact operating through-hole 10. As a result, the spring element 3, as shown in FIG. 6, is bent and displaced from a position indicated by the dotted lines to a position indicated by the solid lines. Depending on the bending displacement of the spring element 3, the spring element 3 is caused to expand while the distal end portion 12 of the spring element 3 is braked by the inner wall of the contact braking through-hole 11. On the other hand, by laterally moving the operating portion 6 in the other direction, the spring element 3 is restored to its normal condition and contracted.

Figure 7B:
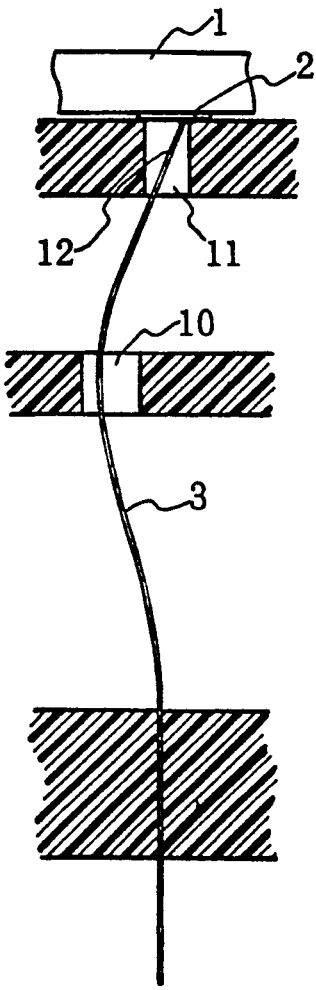
Figure 7C:
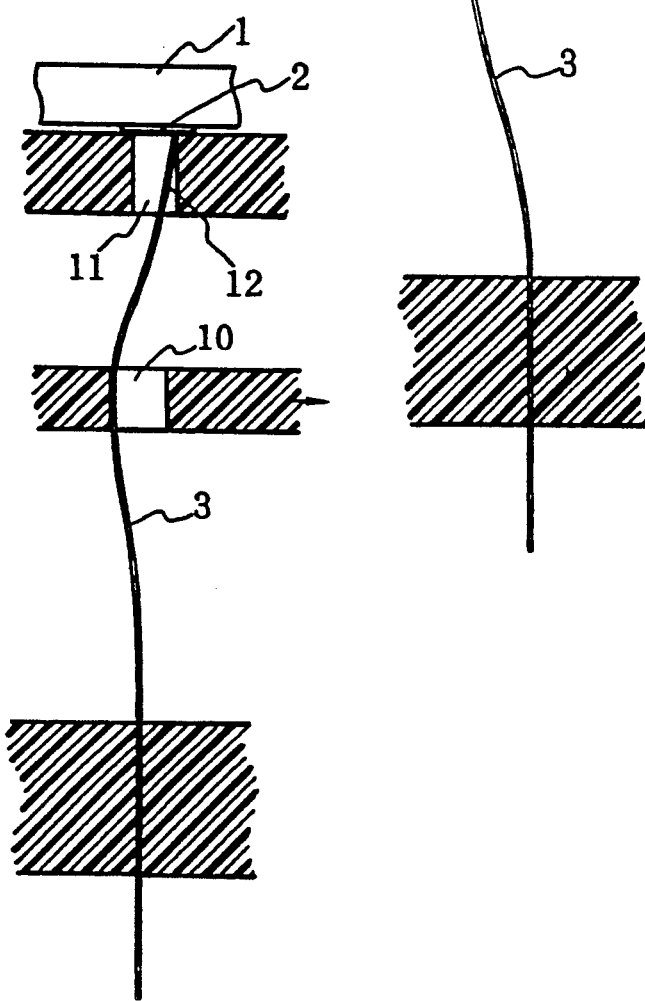

During the above-mentioned expansion process, the distal end portion 12 of the spring element 3 is pressure contacted against the conductive pad 2 of the leadless IC 1. By laterally moving the operating portion 6 in the other direction from its expanded state, a contracted state of the spring element 3 is formed as shown in FIGS. 5, 7(A) and 7(B). The leadless IC 1 is mounted when the spring element 3 is in its contracted state.

This invention can be used not only for a leadless IC as shown in FIG. 8 but also for a leadless IC having a number of conductive pads arrayed along the edge portion of the lower surface of IC, although such is not shown.

As the present invention adopts the above-mentioned contact structure, it can be suitably applied to a connector for a leadless IC having a number of conductive pads arranged on its lower surface. There can be provided a connector which is effective for use with, for example, a leadless IC having a number of conductive pads arranged along the edge portion of its lower surface, and which is also most suitable for the use of an LPG IC, etc., having a number of conductive pads arranged in high density in a lattice shape on the lower surface as shown in FIG. 8.

The present invention is capable of extensively reducing the area occupied by each spring element compared with the conventional leadless IC connector of this type, and of arranging them in extremely high density in a limited area. Therefore, miniaturization of a connector can also be achieved. Furthermore, since bending displacement force is exerted on the spring element by lateral movement of the operating portion and at the same time, the spring contact element is pressure contacted with the conductive pad disposed opposite thereto while the distal end portion of the spring element is braked by the contact braking through-hole, a highly reliable contact can be obtained without fail between each spring element and each conductive pad. That is, by surely pushing the distal end of the spring element against the minute conductive pad, there can be obtained a reliable contact therebetween. Furthermore, it is not required to push down the leadless IC against the spring to obtain a contact pressure as in the conventional connector, and no-load insertion is available in a leadless IC connector.

What is claimed is:

1. A connector for a leadless IC package having conductive pads arranged on a lower surface thereof, said connector comprising:

a plurality of contacts each in the form of an elongated spring element bendable from an initial straight shape by a force exerted in a lateral direction to a bent condition for contracting the length of said spring element and restorable to toward the initial shape for expanding said spring element when the force is released;

a contact holding portion in which said spring elements are fixedly mounted in positions to extend away from said contact holding portion;

a contact braking portion spaced from said contact holding portion in a direction toward which said spring elements extend; and a contact operating portion reciprocally movably disposed between said contact braking portion and said contact holding portion for movement in said lateral direction;

said contact operating portion having a plurality of contact operating through-holes therein through which corresponding spring elements extend, said contact operating through-holes being sufficiently larger than the cross-sections of said spring elements for permitting said spring elements to move freely from the bent condition, caused by movement of said contact operating portion in one direction, toward the initial shape when said contact operating portion is moved in the other direction;

said contact braking portion having a plurality of contact braking through-holes therein through which distal end portions of said spring elements extend when said spring elements are in the initial shape, each of said distal end portions lying against a side of each of said contact braking through-holes which is toward said one direction when said spring elements are in the initial shape, said contact braking through-holes being sufficiently larger than the cross-sections of said spring elements for permitting said distal end portions of said spring elements to move freely in said contact braking through-holes in the lateral direction when said spring elements are being bent for being contracted;

whereby said distal end portions of said spring elements are pivoted laterally in a first direction around the side of said contact operating through-holes which is toward said contact operating portion when said contact operating portion is moved laterally in said one direction for bending and contracting said spring elements and retracting the distal end portions in a direction into said contact braking through-holes, and when said contact operating portion is moved laterally in the other direction, said distal end portions of said spring elements are pivoted in a direction opposite to said first direction as said spring elements are restored toward the initial shape and expand and said distal end portions are urged into positive wiping contact with corresponding conductive pads on an IC package overlying said contact braking through-holes.

2. A connector for a leadless IC package as claimed in claim 1, wherein a shear face of said distal end portion of said spring element is pressure contacted with said conductive pad.

3. A connector for a leadless IC package as claimed in claim 1, wherein said spring element is formed of a straight element having no bent portion.

* * * * *